(12) United States Patent
Woo et al.

(10) Patent No.: US 8,900,474 B2
(45) Date of Patent: Dec. 2, 2014

(54) RECYCLABLE SUPERPARAMAGNETIC NANOPARTICLES AND METHOD FOR PRODUCING THE SAME

(75) Inventors: Kyoungja Woo, Seoul (KR); Seokheon Lee, Seoul (KR); Wooyoung Park, Daegu (KR); Youngbeom Yu, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 196 days.

(21) Appl. No.: 13/530,401

(22) Filed: Jun. 22, 2012

(65) Prior Publication Data

US 2013/0030206 A1    Jan. 31, 2013

(30) Foreign Application Priority Data

Jul. 29, 2011  (KR) .................. 10-2011-0076151

(51) Int. Cl.

| | | |
|---|---|---|
| *C01G 49/02* | (2006.01) | |
| *H01F 1/00* | (2006.01) | |
| *C07F 15/00* | (2006.01) | |
| *C30B 29/22* | (2006.01) | |
| *C01G 49/08* | (2006.01) | |
| *C30B 7/00* | (2006.01) | |
| *C30B 29/60* | (2006.01) | |
| *C30B 29/16* | (2006.01) | |
| *B82Y 40/00* | (2011.01) | |
| *B82Y 30/00* | (2011.01) | |

(52) U.S. Cl.

CPC ............. *C01G 49/08* (2013.01); *C01P 2004/52* (2013.01); *B82Y 40/00* (2013.01); *C01P 2004/64* (2013.01); *C30B 29/22* (2013.01); *C01P 2002/72* (2013.01); *B82Y 30/00* (2013.01); *C30B 7/00* (2013.01); *H01F 1/0054* (2013.01); *C01P 2006/42* (2013.01); *C30B 29/60* (2013.01); *C30B 29/16* (2013.01); *Y10S 977/788* (2013.01); *Y10S 977/896* (2013.01)

USPC ........ 252/62.56; 556/146; 977/788; 977/896; 252/62.51 R

(58) Field of Classification Search

USPC ............ 556/146; 977/788, 896; 252/62.51 R, 252/62.56

See application file for complete search history.

(56) References Cited

U.S. PATENT DOCUMENTS

| | | | |
|---|---|---|---|
| 6,638,494 B1 | 10/2003 | Pilgrimm | |
| 2009/0317327 A1* | 12/2009 | Pilgrimm | .................... 424/1.89 |

FOREIGN PATENT DOCUMENTS

| | | |
|---|---|---|
| CN | 101353181 A | 1/2009 |
| CN | 101640089 A | 2/2010 |
| JP | 2000-507197 A | 6/2000 |
| JP | 2006-104051 A | 4/2006 |

OTHER PUBLICATIONS

Ming Ming Ling, et al; "Highly Water-Soluble Magnetic Nanoparticles as Novel Draw Solutes in Forward Osmosis for Water Reuse", Ind. Eng. Chem. Res. 2010, 49, pp. 5869-5876.

Japanese Notice of Allowance dated Jan. 21, 2014 Appln. No. 2012-138714.

\* cited by examiner

*Primary Examiner* — Porfirio Nazario Gonzalez
(74) *Attorney, Agent, or Firm* — Ladas & Parry LLP

(57) ABSTRACT

A superparamagnetic nanoparticle is comprised of superparamagnetic nanocrystals less than 20 nm in size, and molecules having containing 3 to 5 carboxyl groups, wherein the molecules bond to surfaces of the superparamagnetic nanocrystals. A method for producing superparamagnetic nanoparticles includes preparing an alkaline solution with pH 10 to 14, producing a mixture in which molecules containing 3 to 5 carboxyl groups, a divalent transition metal and ferric precursors are dissolved, and adding the mixture into the alkaline solution.

7 Claims, 5 Drawing Sheets

RECYCLABLE SUPERPARAMAGNETIC NANOPARTICLES AND METHOD FOR PRODUCING THE SAME

CROSS-REFERENCE TO RELATED APPLICATION

The present disclosure relates to subject matter contained in priority Korean Application No. 10-2011-0076151, filed on Jul. 29, 2011, which is herein expressly incorporated by reference in its entirety.

BACKGROUND OF THE INVENTION

1. Field of the Invention

This specification relates to superparamagnetic nanoparticles, and a method for producing the same. Particularly, the superparamagnetic nanoparticles have osmotic-drawing characteristics, have high dispersibility in water and is recyclable. These nanoparticles can be applied as solutes for water treatment system or for desalinating seawater.

2. Background of the Invention

In order to prepare for the lack or exhaustion of water resources, researches into desalinating seawater or treating wastewater through an osmosis membrane filtration process have currently been conducted. Such water treatment employs a reverse osmosis membrane filtration or a forward osmosis membrane filtration. The reverse osmosis membrane filtration process employs a pressurizing type, which causes high energy consumption. So, in recent time, the forward osmosis membrane filtration process is preferred.

However, the forward osmosis membrane filtration has also primary problems to be solved. One of the problems is found in a method for recovering a solute from an osmotic draw solution after execution of the forward osmosis membrane filtration. Studies of using ammonium carbonate as the solute of the draw solution are actively in progress. This material has an advantage of being recyclable, after used, by being decomposed into gas and then collected. However, this method also has drawbacks of causing considerable energy consumption and generating ammonia gas which is harmful to environments and toxic.

To overcome such drawbacks, a study, in which superparamagnetic nanoparticles dispersible in water are used as solutes to draw a forward osmosis, and a magnetic field is used to collect the superparamagnetic nanoparticles from a draw solution for recycling, has been first reported by Ming M. L. et. al in University for Singapore (Ing. Eng. Chem. Res., 2010, 49, 5869-5876). In regard of this document, a mixture of $Fe(acac)_3$ precursor with 2-pyrrolidine, triethylene glycol, or triethylene glycol/polyacrylic acid was refluxed at high temperature over 245° C. so as to produce iron oxide superparamagnetic nanoparticles which are dispersible in water. Here, the superparamagnetic iron oxide nanoparticles, which were produced from the mixture of $Fe(acac)_3$ precursor and triethylene glycol/polyacrylic acid and had surfaces coordinated with polyacrylic acid, showed the most excellent dispersibility and osmosis. This exhibited 7.5 LMH $(L \cdot m^{-2} \cdot hr^{-1})$ permeation flux in a primary desalination experiment using salt water. However, several limitations to the recyclability were observed in this document as well. That is, aggregation of the superparamagnetic nanoparticles was caused to thereby increase the size of the nanoparticles recovered under the magnetic field from 21 nm prior to recovery to 50.8 nm after recovery, and accordingly the permeation flux was decreased down to 2 LMH in a secondary desalination experiment. Also, the synthesis of Ming' study is performed using high-priced $Fe(acac)_3$ precursor at the high temperature of 245° C., so it is not economical.

The osmosis increases in proportion to osmolality of a solute which is dissolved or dispersed in water. Hence, materials, which are dissolved or dispersed in water to provide more solutes and easier to be recovered and recycled, exhibit advantages in economical and eco-friendly aspects. Nanoparticles have many number of organic molecules bonded on surfaces thereof, so water-dispersibility of the nanoparticles and osmolality are in a directly proportional relationship up to a critical concentration. The water-dispersibility of the superparamagnetic nanoparticles is determined by a hydrodynamic size in water, and it is preferable for the nanoparticles to have a size smaller than 20 nm and exhibit a monodispersed distribution.

In general, when the size of a magnetic nanocrystal exceeds 20 nm, the nanocrystal has ferromagnetism or ferrimagnetisms, which makes it impossible to control the aggregation of the magnetic nanoparticles. Iron oxide nanoparticles synthesized by the traditional coprecipitation method may have a size less than 20 nm, but be aggregated due to high surface energy with less surface charge. Thus, it has been known that the hydrodynamic size distribution of the magnetic nanoparticles is wide away.

In the meantime, hydrophobic superparamagnetic nanoparticles synthesized in nonpolar organic solution, as recently reported, exhibit a monodispersed distribution in size and are well dispersed in a nonpolar organic solvent, but not dispersed in water. In order for the hydrophobic superparamagnetic nanoparticles to have the water-dispersibility, they must go through a surface modification process, but the surface modification is complicated and non-economical. Also, even after the surface modification, it is difficult to have hydrodynamic monodispersibility. In addition, economic performance and practicability should have priorities in processes, such as desalination of seawater, requiring for a large quantity of materials made with low costs.

SUMMARY OF THE INVENTION

Therefore, to address such drawbacks of the related art, an aspect of the detailed description is to provide superparamagnetic nanoparticles having a high surface charge, a uniform particle size and excellent water-dispersibility, namely, exhibiting a small hydrodynamic size less than 20 nm and a monodispersed distribution, and a method for producing the same.

Another aspect of the detailed description is to provide superparamagnetic nanoparticles exhibiting high osmosis-drawing characteristics and recyclability by virtue of excellent dispersibility being maintained upon re-dispersion even though being recovered under a magnetic field.

Another aspect of the detailed description is to provide superparamagnetic nanoparticles with the best dispersibility by reaction at room temperature using lowest-priced precursors.

Another aspect of the detailed description is to provide superparamagnetic nanoparticles capable of being economically and practically used as solutes for water treatment such as seawater desalination.

To achieve these and other advantages and in accordance with the purpose of this specification, as embodied and broadly described herein, there is provided a nanoparticle comprising of superparamagnetic nanocrystals less than 20 nm in size, and molecules containing 3 to 5 carboxyl groups, wherein the molecules bond to surfaces of the superparamagnetic nanocrystals.

The superparamagnetic nanocrystals may be at least one type selected from a group consisting of $\gamma\text{-}Fe_2O_3$, $MnFe_2O_3$, $Fe_3O_4$, $CoFe_2O_3$, and $NiFe_2O_3$.

The molecules containing the 3 to 5 carboxyl groups may be at least one type selected from sodium citrate, ethylenediaminetetraacetic acid (EDTA), and ethylenetriaminepentaacetate (ETPA).

According to a method for producing nanoparticles according to this specification, a solution, in which molecules containing 3 to 5 carboxyl groups, a divalent transition metal and ferric precursors are mixed, is added into an alkaline solution with pH 10 to 14, thereby synthesizing nanoparticles consisting of the superparamagnetic nanocrystals and the molecules containing the 3 to 5 carboxyl groups, wherein the superparamagnetic nanocrystals have the molecules bonded to the surfaces thereof.

A method for producing nanoparticles according to this specification may include preparing an alkaline solution with pH 10 to 14, producing a mixture in which molecules containing 3 to 5 carboxyl groups and ferric precursors are dissolved, and adding the mixture into the alkaline solution.

The divalent transition metal may be at least one type selected from a group consisting of $Mn^{2+}$, $Fe^{2+}$, $Co^{2+}$, and $Ni^{2+}$.

The molecules which are containing the 3 to 5 carboxyl groups may be at least one type selected from sodium citrate, ethylenediaminetetraacetic acid (EDTA), and ethylenetriaminepentaacetate (ETPA).

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

Effect of the Invention

According to this specification, an iron precursor solution, which contains a ligand material having at least 3 carboxyl groups, is added into an alkaline solution so as to synthesize superparamagnetic nanoparticles, which are economical, practical and highly dispersible in water, namely, have a small hydrodynamic size less than 20 nm. The superparamagnetic nanoparticles can be used for water treatment, such as seawater desalination, by virtue of their excellent osmosis-drawing characteristics and recyclability, and also be utilized as nanofluids for heat-exchangers and MR contrast agents which require for the excellent dispersibility.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Figure 1:
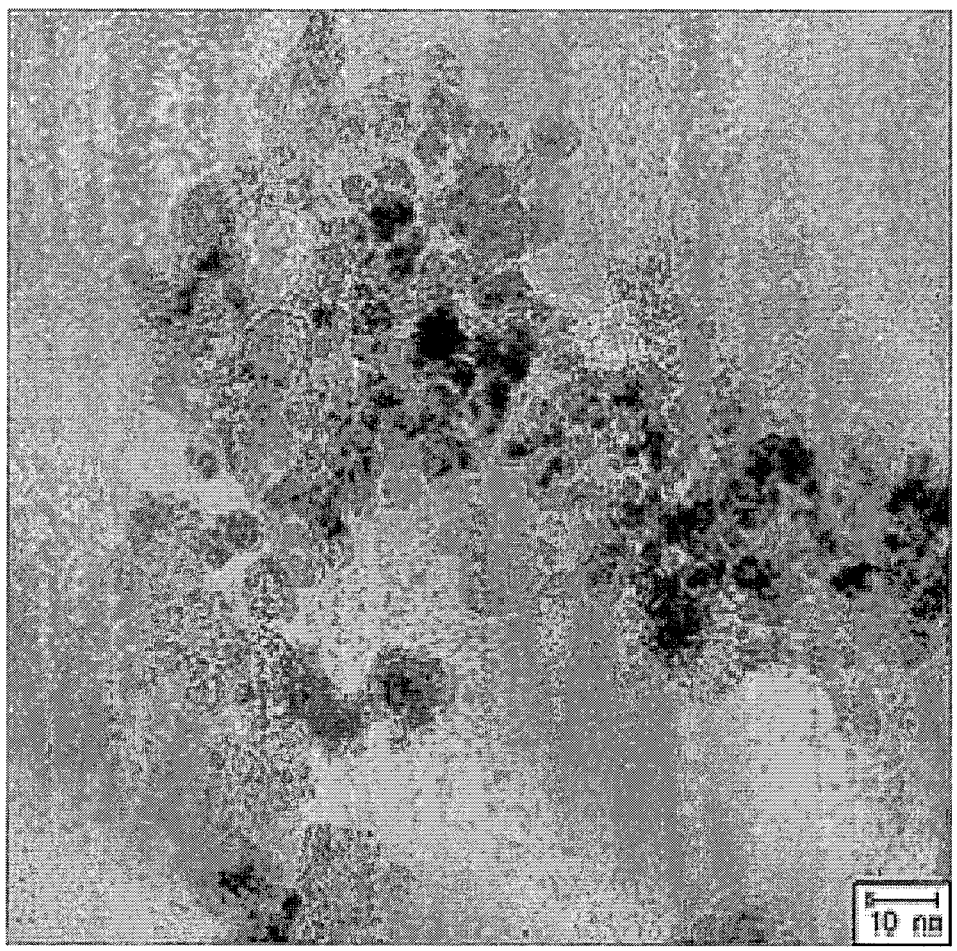
FIG. 1 is Transmission Electron microscopic (TEM) image of iron oxide nanoparticles synthesized in Example 1.
Figure 2:
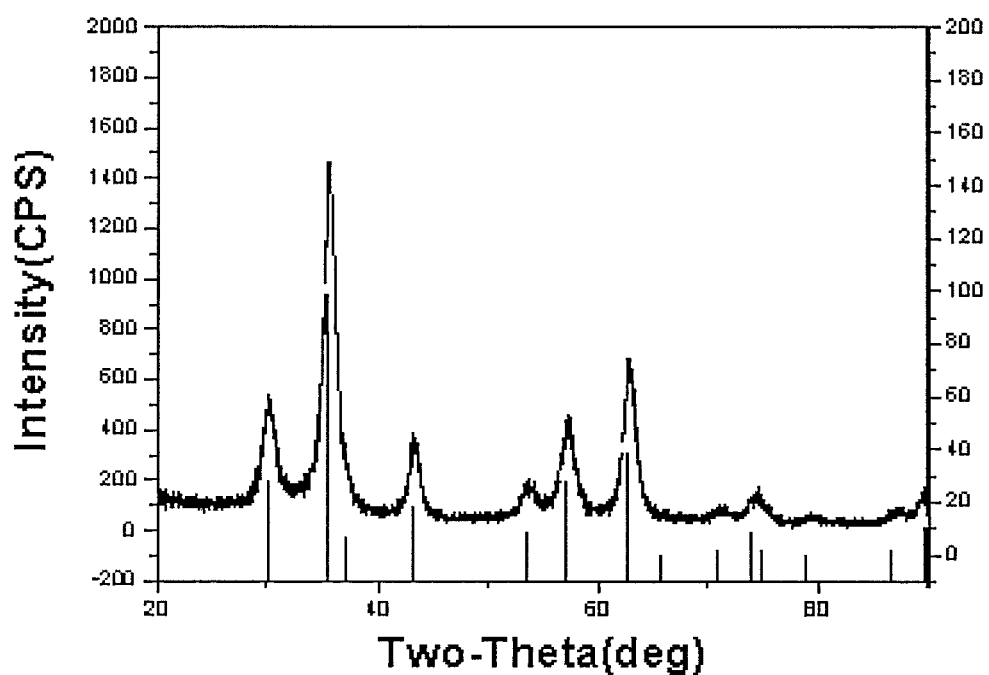
FIG. 2 is X-Ray Diffraction (XRD) pattern showing that the nanoparticle synthesized in Example 1 is $Fe_3O_4$ (magnetite) phase.
Figure 3:
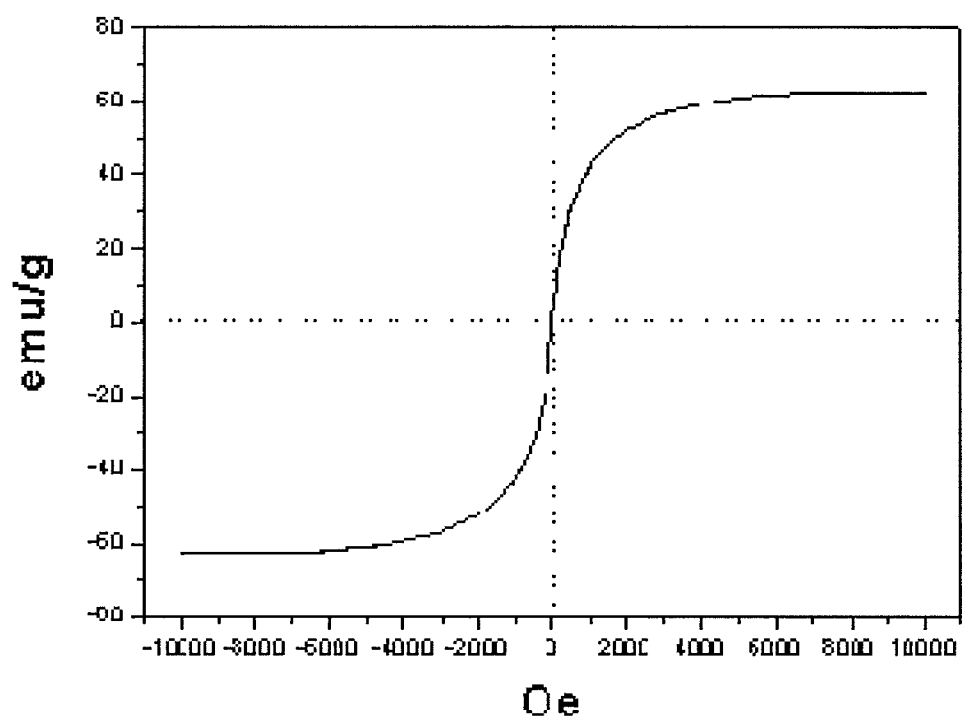
FIG. 3 is a hysteresis curve showing superparamagnetic property of the iron oxide nanoparticles synthesized in Example 1.
Figure 4:
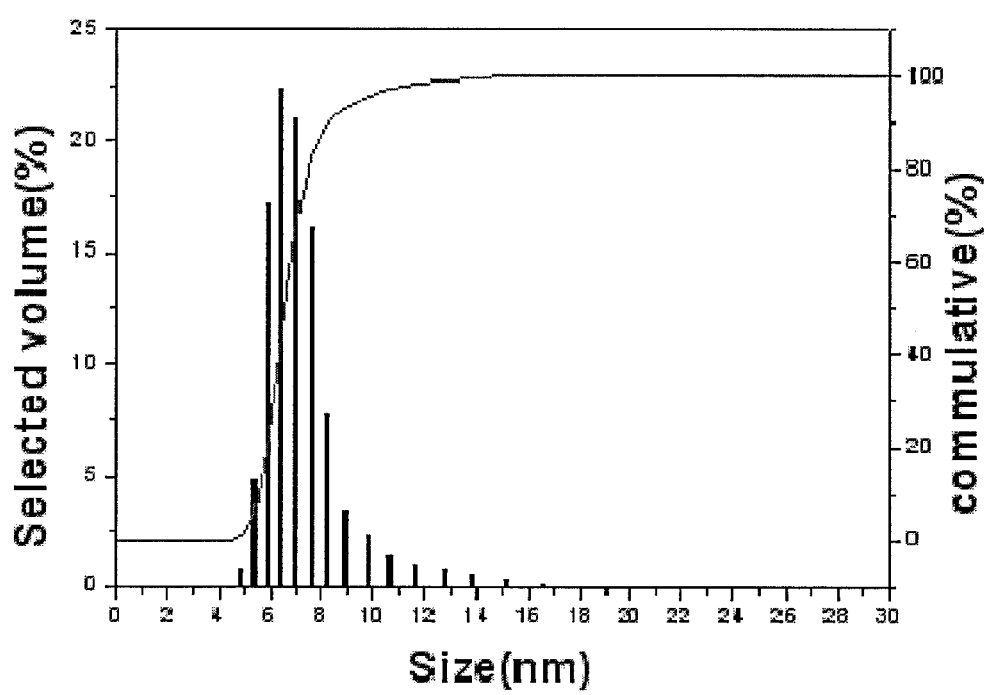
FIG. 4 shows analysis results of hydrodynamic diameters of the iron oxide nanoparticles synthesized in Example 1, which are collected using a magnet and then dispersed in water.

The present inventors who have long-term expertise for superparamagnetic iron oxide nanoparticles have recognized the following two facts, namely, the first fact that a ligand which is the most stably coordinated to the superparamagnetic iron oxide nanoparticles is a carboxyl group, and the second fact that a ligand material having at least 3 carboxyl groups is required to increase water-dispersibility of the superparamagnetic iron oxide nanoparticles by electrostatic repulsion.

However, the present inventors have determined that if the organic polymer is used as shown in the document such as Ming M. L., some freely dangling polyacrylic acid chains get agglomerated together and many number of carboxyl groups existing on one polymer molecule are coordinated to different nanoparticles, thereby causing the aggregation of the nanoparticles. In other words, according to our analysis, as organic ligands used by them consist of polymers called polyacrylic acid, some parts of polymer chains, which are freely dangling, get twisted while the nanoparticles are recovered by the magnetic field, and one polymer molecule has too many number of carboxylic acid (—COOH) functional groups, whereby those carboxyl (—COO$^-$) groups are coordinated to different nanoparticles, respectively, to instead cause the aggregation of the nanoparticles.

Hence, superparamagnetic iron oxide nanoparticles having excellent dispersibility in water, osmosis-drawing characteristics and recyclability have been produced according to the configuration of the present disclosure of selecting simple organic molecules having 3 to 5 carboxyl groups as ligands and using low-priced iron precursors at room temperature.

The superparamagnetic iron oxide nanoparticles have a small hydrodynamic size less than 20 nm and exhibit a monodisperse distribution. Although it is not especially necessary to limit the lowest limit of the size of the nanoparticle, the nanoparticle exhibits superparamagnetism and oxidation stability as high as being practically useful when it is at least 2~3 nm in size, so it is preferable to limit the lowest limit to 2 nm.

Meanwhile, according to traditional coprecipitation of the related art described in the background of the invention, it has been known that $\gamma\text{-}Fe_2O_3$, $MnFe_2O_3$, $CoFe_2O_3$, and $NiFe_2O_3$ nanoparticles are synthesized when $Fe^{2+}$ is omitted or a different type of divalent transition metal instead of $Fe^{2+}$ is used under the same traditional method and conditions as creating $Fe_3O_4$ nanoparticles, although nanoparticles are disadvantageously aggregated. Consequently, the method for producing superparamagnetic $Fe_3O_4$ nanoparticles of the present disclosure, which exhibit excellent dispersibility in water, osmosis-drawing characteristics and recyclability, can be applied directly to production of $\gamma\text{-}Fe_2O_3$, $MnFe_2O_3$, $CoFe_2O_3$, and $NiFe_2O_3$ nanoparticles.

Hereinafter, description will be given in detail of illustrative examples of the present disclosure. The illustrative examples are intended to help clearer and easier understanding of the present disclosure, and should not be construed to limit the scope of the present disclosure.

Example 1

Production of Superparamagnetic Iron Oxide Nanoparticles Having Size Less than 20 nm in Water and Monodispersed Distribution 9.54 g of $FeCl_2.4H_2O$, 25.9 g of $FeCl_3.6H_2O$ and 7.2 g of sodium citrate were added and dissolved into 75 mL of distilled water in a sequential manner, thereby preparing a solution (Solution 1). Meanwhile, a mechanical stirrer was installed on a three-prong flask with a capacity of 2 L, and 750 mL of 1 M NaOH solution was prepared (Solution 2). While stirring the solution 2, the solution 1 was slowly added into the solution 2. After stirring the mixture for 5 hours more, iron oxide nanoparticles having a size of about 7 nm were produced. After reaction completed, the solution was centrifuged to obtain the nanoparticles. The obtained nanoparticles were washed using ethanol more than two times, and then dispersed in 250 mL of ethanol. From 10 mL of this solution were collected solids by use of a magnet. The collected solids were completely dried. A weight of the solids was measured as 1.3 g, and thus a yield of the whole reaction was determined as 32.5 g.

A TEM image, an XRD pattern, a magnetic hysteresis curve, a hydrodynamic diameter and the like of the nanoparticles were analyzed, and the results were shown in FIGS. 1 to 4. The TEM image showed uniform nanoparticles having a size of about 7 nm. The XRD analysis results showed formation of $Fe_3O_4$ phase, and a saturation magnetization was 62 emu/g, from which superior superparamagnetism was exhibited. The hydrodynamic diameter was 7.06±1.51 nm, in spite of the magnetic field being already applied, resulting in a monodispersed distribution. Hence, it was confirmed that the nanoparticles had excellent dispersibility without aggregation.

Example 2

Seawater Desalination Experiment

A seawater desalination experiment using forward osmosis was carried out by using 0.0065 M nanoparticle solution, which was prepared in Example 1, as a draw solution. 3.5% salt water was prepared to be used as seawater. A celluloid triacetate (CTA) membrane produced by Hydration Technology Innovations (HTI) was used as a membrane. Water flux when using the nanoparticles according to the present disclosure was measured, under conditions that the draw solution and a capacity of reservoir were 500 mL, respectively, a flow rate was 8.5 m/sec, and 10-hour operation was performed. The measurement result was 8 LMH, which was an excellent performance. It was confirmed that the superparamagnetic nanoparticles were easily recoverable from the draw solution using a magnet after operation, and recyclable by virtue of re-dispersibility thereof.

Example 3

Figure 5:
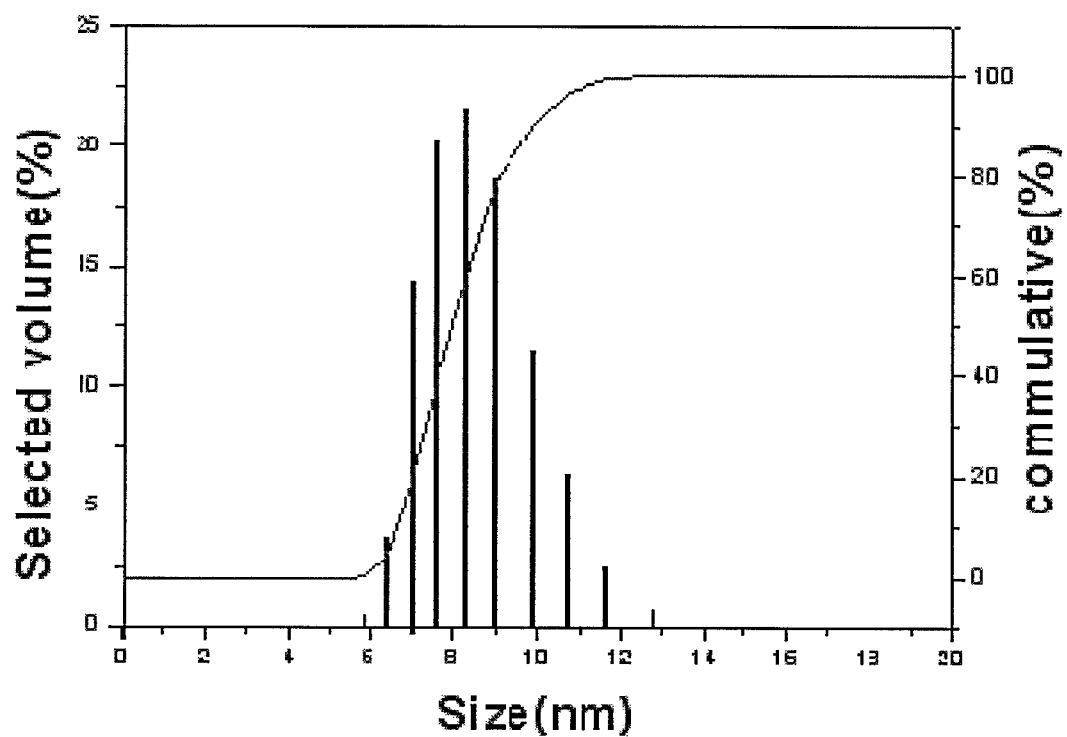
FIG. 5 shows analysis results of hydrodynamic diameters of nanoparticles, which are stirred in salt water (seawater) for 1 hour, collected using a magnet and dispersed in water.

Dispersibility in Salt Water of Superparamagnetic Iron Oxide Nanoparticles Having Size of 7.06 Nm in Water and Monodispersed Distribution To estimate dispersibility of the nanoparticles under rigorous conditions using the nanoparticles produced in Example 1, the following experiment was carried out. Salt water with the same saline concentration (3.5%) as seawater was prepared. The nanoparticles produced in Example 1 were added to the salt water such that the concentration became 0.0065 M. This solution was stirred for 1 hour, and the nanoparticles were recovered by use of a magnet, followed by two-time washing, and then dispersed in water. Hydrodynamic diameters of the nanoparticles dispersed in water were analyzed, and the results were 8.1±1.2 nm. Accordingly, it was confirmed that no aggregation was caused before and after use of the nanoparticles. The results are shown in FIG. 5.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. An osmotic draw solute, comprising:
   superparamagnetic nanocrystals having a size of 20 nm or smaller; and
   molecules containing 3 to 5 carboxyl groups,
   wherein the molecules bond to surfaces of the superparamagnetic nanocrystals.

2. The osmotic draw solute of claim 1, wherein the superparamagnetic nanocrystals are at least one selected from a group consisting of $\gamma$-$Fe_2O_3$, $MnFe_2O_3$, $Fe_3O_4$, $CoFe_2O_3$, and $NiFe_2O_3$.

3. The osmotic draw solute of claim 1, wherein the molecules containing the 3 to 5 carboxyl groups are at least one selected from sodium citrate, ethylenediaminetetraacetic acid (EDTA), and diethylenetriaminepentaacetate (DTPA).

4. A method for producing an osmotic draw solute, the method comprising:
   preparing a NaOH solution with a pH of between 13 to 14;
   producing a mixture in which molecules containing 3 to 5 carboxyl groups, a divalent transition metal and ferric precursors are dissolved;
   adding the mixture into the NaOH solution with stirring at a temperature in the range of 15 to 30° C.,
   wherein the osmotic draw solute comprises superparamagnetic nanocrystals having a hydrodynamic size of 20 nm or smaller and a monodispersed size distribution; and
   molecules containing 3 to 5 carboxyl groups bound to surfaces of the superparamagnetic nanocrystals.

5. The method of claim 4, wherein the divalent transition metal is at least one selected from a group consisting of $Mn^{2+}$, $Fe^{2+}$, $Co^{2+}$, and $Ni^{2+}$.

6. A method for producing an osmotic draw solute, the method comprising:
   preparing a NaOH solution with a pH of between 13 to 14;
   producing a mixture in which molecules containing 3 to 5 carboxyl groups and ferric precursors are dissolved; and adding the mixture into the NaOH solution with stirring at a temperature in the range of 15 to 30° C., wherein the osmotic draw solute comprises superparamagnetic nanocrystals having a hydrodynamic size of 20 nm or smaller and a monodispersed size distribution; and molecules containing 3 to 5 carboxyl groups bound to surfaces of the superparamagnetic nanocrystals.

7. The method of claim 4, wherein the molecules having the superparamagnetic nanocrystals bound to the surfaces thereof and containing the 3 to 5 carboxyl groups are at least one type selected from sodium citrate, ethylenediaminetetraacetic acid (EDTA), and diethylenetriaminepentaacetate (DTPA).

* * * * *